United States Patent
Yokogawa et al.

(10) Patent No.: US 6,977,229 B2
(45) Date of Patent: Dec. 20, 2005

(54) MANUFACTURING METHOD FOR SEMICONDUCTOR DEVICES

(75) Inventors: Kenetsu Yokogawa, Tsurugashima (JP); Yoshinori Momonoi, Kokubunji (JP); Masaru Izawa, Hino (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/460,155

(22) Filed: Jun. 13, 2003

(65) Prior Publication Data

US 2004/0018727 A1 Jan. 29, 2004

(30) Foreign Application Priority Data

Jul. 25, 2002 (JP) .................................... 2002-216011

(51) Int. Cl.[7] ............................................. H01L 21/302
(52) U.S. Cl. ...................... 438/710; 438/725; 438/732
(58) Field of Search ............................... 438/710, 725, 438/732, 711, 729; 156/345; 257/640, 642–644, 650

(56) References Cited

U.S. PATENT DOCUMENTS 6,713,401 B2 * 3/2004 Yokogawa et al. ......... 438/710

FOREIGN PATENT DOCUMENTS

| JP | 8-85887 | 9/1994 |
|---|---|---|
| JP | 8-131981 | 11/1994 |
| JP | 9-17776 | 6/1995 |

* cited by examiner

Primary Examiner—Carl Whitehead, Jr.
Assistant Examiner—Yennhu B. Huynh
(74) Attorney, Agent, or Firm—Reed Smith LLP; Stanley P. Fisher, Esq.; Juan Carlos A. Marquez, Esq.

(57) ABSTRACT

The present invention is provided to prevent yield reduction of semiconductor device in dry cleaning of semiconductor device manufacturing process. The electric action and chemical action due to plasma of a first gas generated by means of a plasma generating means and the physical action due to viscous friction force of high speed gas flow generated by means of a planar pad that is brought close to the main surface of a wafer are applied together for cleaning the main surface of the wafer. After cleaning, the wafer is exposed to plasma of a second gas in the same vacuum chamber and then transferred to the atmosphere.

19 Claims, 7 Drawing Sheets

MANUFACTURING METHOD FOR SEMICONDUCTOR DEVICES

BACKGROUND OF THE INVENTION

1. Field of the Invention

This invention relates to a manufacturing method for semiconductor devices involving cleaning, and particularly relates to a manufacturing method for semiconductor devices involving cleaning process to remove residual particles on the semiconductor wafer surface.

2. Description of Related Art

A manufacturing method for semiconductor devices involving fine processing (LSI, VLSI and the like) has been developed. In this situation, a cleaning process for cleaning semiconductor devices is one of important processes in manufacturing process for improving manufacturing yield of semiconductor device. Cleaning is carried out as pre-treatment or aftertreatment of some processes such as film forming and etching.

Conventionally, semiconductor wafers (referred to as wafers hereinafter) are cleaned with pure water or diluted solution containing various acids or alkalis in pure water by means of dipping of wafer in the solution or spraying of the solution on wafer to clean off particles on the wafer surface. A method in which a wafer is dipped in a solution and the wafer surface is brushed mechanically in the solution has also been employed. Such cleaning method is called "wet cleaning" because of the fact that a solution is used.

However, wet cleaning requires subsequent rinsing and drying processes in addition to cleaning process to result in increased multi-step process. The multi-step process is a problem.

Dry cleaning has been known as cleaning method that solves the problem of wet cleaning.

One of the dry cleaning methods is disclosed in, for example, JP-A No. 131981/1996 (referred to as known literature 1 hereinafter). According to the known literature 1, an object to be cleaned, for example, a 6-inch silicon wafer for semiconductor that has been formed by slicing, lapping, and polishing a single crystal silicone, is cleaned with activated air at dry room temperature condition to remove particles adsorbed electrostatically on the object to be cleaned. In detail, the activated air contains air ions and water clusters to form high humidity atmosphere. The flowing activated air cleans an object to be cleaned in a cleaning chamber in contact with the object. The air ions neutralize electric charges of the object to be cleaned, and the water clusters isolate particles from the surface of the object to be cleaned. The flowing activated air peels off and removes particles. The known literature 1 discloses pre-treatment cleaning for LSI manufacturing that is carried out after purchase of Si wafer from a wafer maker in detail.

Another dry cleaning method is disclosed in JP-A No. 85887/1996 (referred to as known literature 2 hereinafter) According to the known literature 2, a W sample to be etched having single film or laminated film is etched, and then transferred to an aftertreatment equipment (treatment equipment used in the next process) by means of a vacuum transfer equipment. Resist and particles are removed (plasma ashing) together in the aftertreatment equipment (in vacuum) without exposing the sample in the atmosphere.

Yet another dry cleaning method is disclosed in JP-A No. 17776/1997 (referred to as known literature 3 hereinafter). According to the known literature 3, to form a film that is accessible to adsorbed organic substance on a semiconductor substrate when the film is formed, the film is cleaned with $O_3$ in room temperature or high temperature condition in the same semiconductor manufacturing equipment to remove adsorbed organic substance before film forming of an under layer film and to thereby stabilize film forming that is sensitive to the surface condition of the semiconductor substrate. In other words, according to the known literature 3, $O_3$ gas is introduced into the semiconductor manufacturing equipment that was used to form the under layer wiring pattern on the semiconductor substrate to clean the semiconductor substrate. At that time, $O_3$ gas reacts with residual organic substance on the semiconductor surface, and the organic substance is removed in the form of volatile products such as CO or $CO_2$.

Recently, system-on-chip (so-called system LSI) that is typical of job shop type product has become major instead of DRAM that is typical of less-item mass-production type product. The job shop type production regards short TAT (Turn Around Time) important to increase the production efficiency.

Hence it is required to employ dry cleaning process for cleaning that is carried out as pre-treatment or aftertreatment of semiconductor device manufacturing process.

High performance device requires new materials including hygroscopic film materials such as organic film that is so-called as Low-k film (low dielectric constant film having a dielectric constant of 3.0 or lower) and porous organic film such as interlayer dielectric. Wet cleaning and even the exposure to the atmosphere cause conversion of device quality in semiconductor device manufacturing process in which such new materials are used.

SUMMARY OF THE INVENTION

It is an object of the present invention to provide a cleaning method for cleaning semiconductor devices effectively in vacuum by means of cleaning in vacuum in semiconductor device manufacturing process to solve the problem of wet cleaning.

It is another object of the present invention to improve the manufacturing yield and reduce the cost in the semiconductor device manufacturing process.

It is another object of the present invention to improve the precision and bring about low cost production of semiconductor devices in 0.1 $\mu$m process.

According to the present invention, cleaning is carried out efficiently in dry and vacuum atmosphere. Particularly, the present invention is applied effectively for cleaning of substrates (wafer) in semiconductor device manufacturing process for manufacturing semiconductor devices containing material that is sensitive to moisture, excessive chemicals, and excessive force.

There are many contact holes (through holes) and corners of wiring on the main surface of a wafer in semiconductor device manufacturing process. The cleaning effect on such wafer surface will be described herein under briefly.

The viscous friction due to gas flow acts physically to remove particles 59 that are deposited in the space between the main surface of a pad shape substance and the surface of a wafer, and hence the cleaning is effective over the area on which the gas is flowing.

On the other hand, in the conventional wet cleaning, it is difficult for the liquid to penetrate into fine space because of the surface tension of the liquid, the cleaning effect is insufficient for the process involving dimension of 0.3 $\mu$m or smaller. However, because gas flow is used in the present invention, the cleaning is effective for semiconductor integrated circuit devices, which will have further finer structure in the future.

According to the present invention, it is possible to improve the process efficiency and reduce the damage due to plasma by applying plasma irradiation and frictional force simultaneously or separately in the time.

Further more, according to the present invention, the conversion of a wafer that is caused after exposure to the atmosphere is prevented by treating with plasma of the second gases after the wafer is cleaned, and hence the high precision and high yield semiconductor device manufacturing process is performed.

Further particularly, the manufacturing method for semiconductor devices of the present invention is effective for manufacturing of system LSI, which requires short TAT, such as LSI having memo LSI and logic LSI mixedly. The efficient cleaning brings about short time, low cost, and high yield manufacturing of system LSI.

An invention that is representative in the inventions disclosed in the present invention will be described briefly herein under.

One of the inventions involves a manufacturing method for semiconductor devices including:

a step for preparing a dry cleaning system having a vessel connected to a vacuum pump, a means for generating plasma, a gas supply means for supplying gas that is material for generating plasma, a wafer stage provided in the vessel on which the wafer is set, a planar pad provided with a gas hole for injecting gas and a flat part facing to the wafer, and a means for scanning the planar pad on the wafer surface;

a step for setting the wafer on the wafer stage;

a step in which the vessel is maintained vacuum by means of the vacuum pump, gas that is material for generating plasma is supplied into the vessel by means of the gas supply means, and plasma is generated in the vessel by means of the means for generating plasma;

a step in which the flat part of the planar pad is brought close to the wafer main surface and the first gas is injected from the gas hole to thereby apply the flow frictional force due to gas flow of the first gas and action of electric charges or radicals generated by means of plasma simultaneously, and the main surface of the wafer is cleaned;

a step in which plasma of a second gas is generated in the vessel and the main surface of the wafer is exposed to the plasma after the above-mentioned cleaning step; and a step for transferring the wafer to the outside of the vessel.

The above-mentioned and other objects and innovative characteristics of the present invention will be apparent from the detailed description and attached drawings of the present specification.

BRIEF DESCRIPTION OF THE DRAWINGS

Preferred embodiments of the present invention will be described in detail based on the followings, wherein.

DETAILED DESCRIPTION OF THE PREFERRED EMBODIMENTS

Embodiment 1

Structure of a dry cleaning system to be applied to the cleaning method of the present invention will be described below with reference to FIG. 1.

The word "wafer" described in the following detailed embodiments generally includes silicon wafer, epitaxial wafer, compound semiconductor wafer (for example, GaAs wafer), and SOI wafer comprising a semiconductor layer formed on a dielectric-layer unless otherwise specified.

Figure 1:
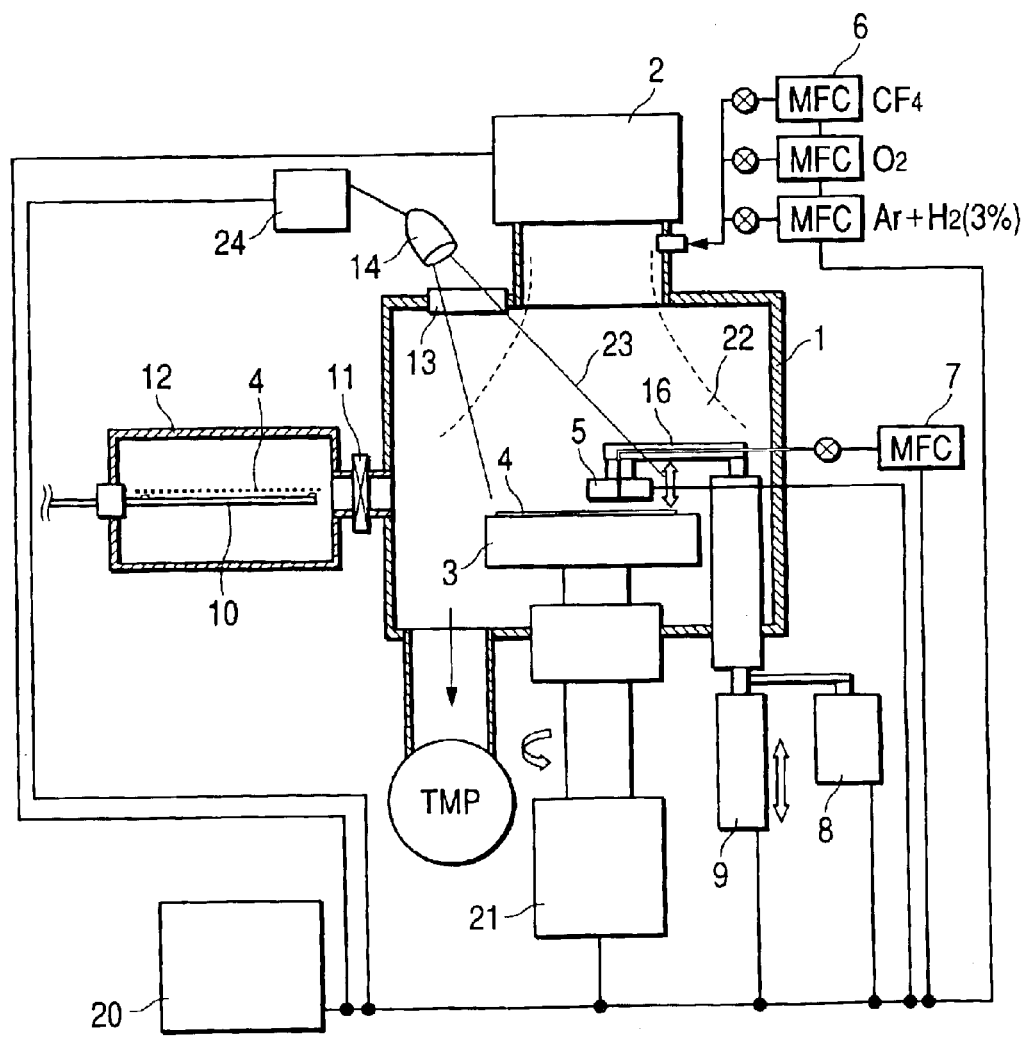
FIG. 1 is a basic structural diagram of a dry cleaning system to be applied to the present invention.

The structure of a dry cleaning system shown in FIG. 1 comprises basically a vessel (chamber) 1, a vacuum pump for reducing the pressure in the vessel 1 to a predetermined pressure, for example, a turbo molecular pump TMP having a capacity of 2000 1/sec, a means 2 for generating plasma, a means (mass flow controller MFC) 6 for supplying gas that is to be raw material of plasma, a wafer setting means (circular stage) 3 on which a wafer is set that is a sample to be processed, a planar pad 5 having a function to inject gas against the wafer surface, and a swing motion mechanism 8 for scanning the planar pad 5 on the wafer surface.

The wafer 4 is transferred from a transfer chamber 12 connected through a valve 11 to the vessel 1 by means of a transfer arm 10, and set on the wafer setting means (wafer stage) 3.

$CF_4$, $O_2$, Ar, or Ar+$H_2$(3%), which is raw material of plasma, is supplied from the gas supply means 6 to the vessel 1. A gas introduction means 7 connected to the planar pad 5 having a function to inject gas is provided independently of the gas supply means 6 for supplying gas that is used as raw material of plasma to be generated by the plasma generating means.

Ar is injected from the gas supply means 6 against the main surface of wafer 4 set on the circular stage 3 through the planar pad 5. The planar pad 5 is provided with the swing motion mechanism 8 for scanning on the wafer 4 surface and an actuator function 9 served to bring the planar pad 5 close to the wafer 4 surface. An infrared lamp 14 is provided near the vacuum vessel 1 so that infrared ray comes into the vessel 1 through a window 13. The light emitted from the infrared lamp 14 is irradiated to heat the wafer though it is described hereinafter.

Figure 2A:
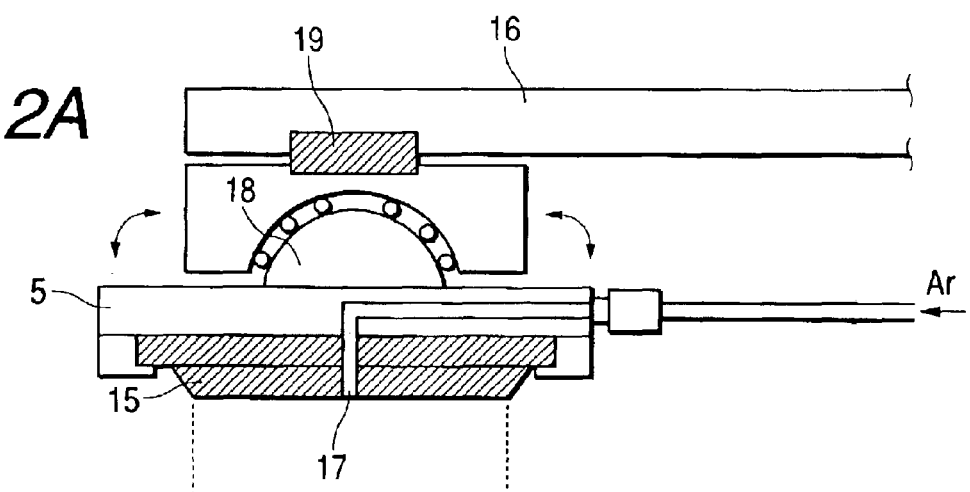
FIG. 2A is a structural side view of a planar pad of the dry cleaning system to be applied to the present invention.
Figure 2B:
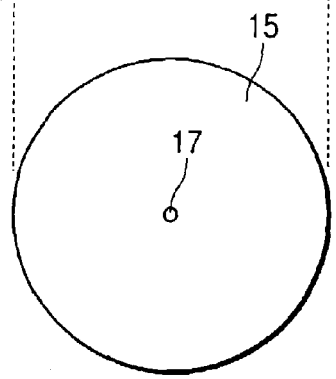
FIG. 2B is a structural plan view of a dry cleaning system to be applied to the present invention.

FIG. 2A and FIG. 2B show a detailed structural diagram of the planar pad 5. FIG. 2A is a cross sectional view of the planar pad 5 and FIG. 2B is a plan view of a pad part 15. The planar pad 5 comprises a pad part 15 that comes close to the wafer 4 surface, a pad holding part 16 for holding the pad part, a gas injecting part 17, a movable part 18 for bringing the pad part close to the surface to be processed always, and a load detection part 19 for detecting a load loaded between the wafer surface and the pad part when the pad part is brought close to the wafer surface. The load detection part 19 is connected electrically to a control part 20 shown in FIG. 1. The actuator function 9 is controlled through the control part 20 in response to the load detected by means of the load detection part 19 to thereby control the space between the planar pad 5 and the wafer 4. The pad part 15 is formed of Teflon, which is a material stage to plasma exposure. One of other materials such as poly-vinyl alcohol, Derlin, Vespel, Kapton, poly-vinyl chloride, polyester, silicon oxide, silicon, and aluminum oxide may be used.

Figure 3:
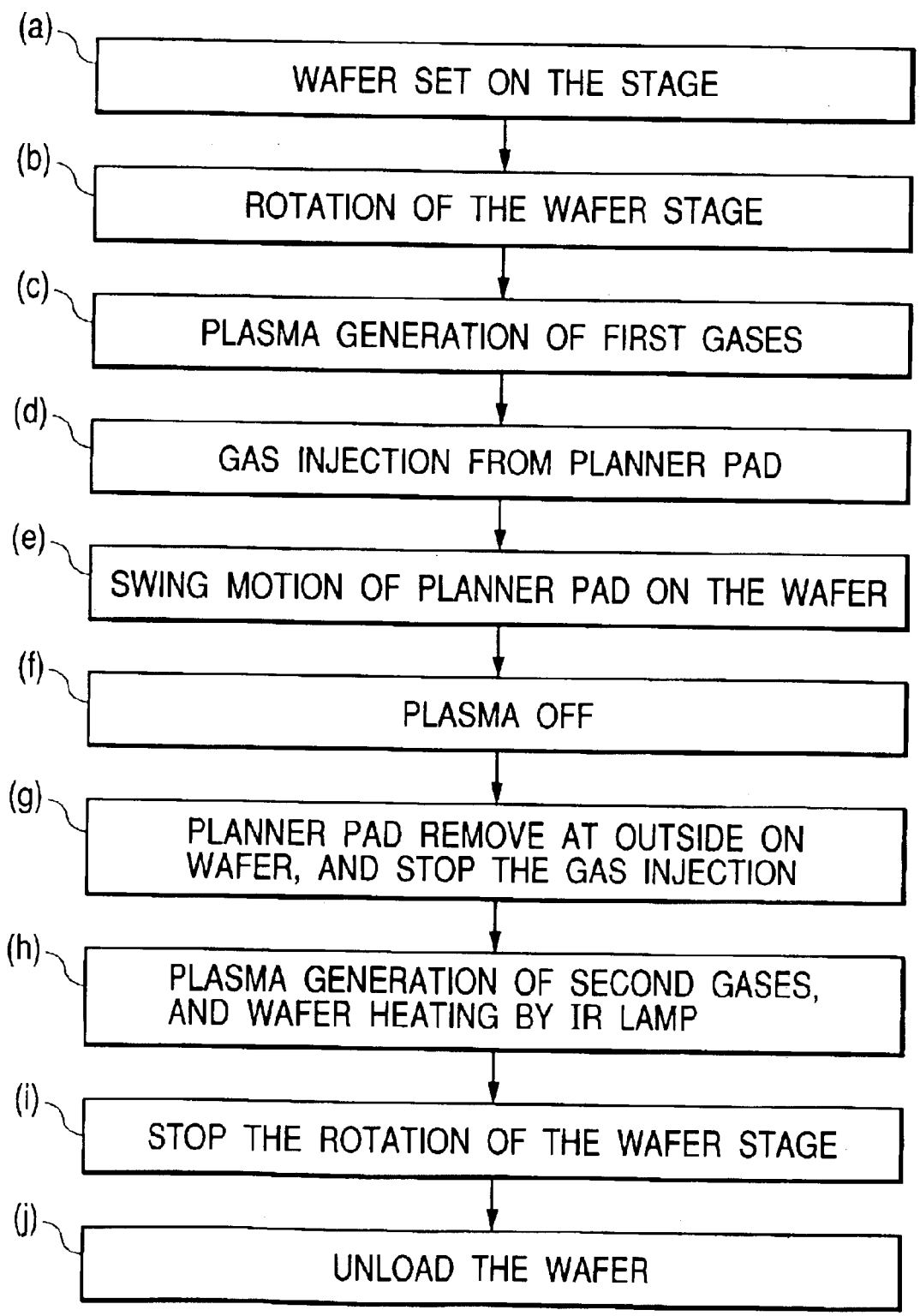
FIG. 3 is a cleaning flow chart applied in embodiment 1 of the present invention.

Next, a manufacturing process for semiconductor devices that employs the above-mentioned dry cleaning system will be described with reference to FIG. 3.

(a) At first, a wafer 4 to be cleaned is transferred onto the wafer setting means 3 from the transfer chamber 12 by use of a transfer arm 10. The wafer 4, for example, has a dielectric film (oxide film) on the main surface and a contact hole or through hole formed on the dielectric film.

(b) Subsequently, the internal of the vessel 1 is kept vacuum by means of turbo molecular pump, and the wafer 4 is rotated in the circumference direction by means of rotation function of the wafer setting means 3. In the present embodiment 1, the wafer 4 is rotated at a rotational speed of 200 rpm. The rotation speed relates to the particle removal throughput and is controlled optionally.

(c) Subsequently, $CF_4$ and $O_2$ are introduced into the vacuum vessel as the first gas by means of the gas introducing means 6. At that time, 20 sccm of $CF_4$ and 40 sccm of $O_2$ are introduced in the present embodiment 1 as the first gas. The first gas is used as the raw material to generate plasma by means of the plasma generating means 2. Fluorine radials and minute electric charges supplied from the plasma onto the wafer 4 surface reduce the adsorption force of fine particles adsorbed on the wafer 4 surface. For example, minute electric charge neutralizes electric charges of fine particles adsorbed electrostatically on the wafer surface to thereby reduce the adsorption force. On the other hand, fluorine radical reduces the adsorption force of adsorption particles of stick on surface by means of slight etching action on the wafer surface, and acts to reduce the chemical adsorption force itself between particles and wafer surface.

(d) Subsequently, the pad part 15 of the planar pad 5 is brought close to the wafer 4 surface to a distance of 100 $\mu$m or shorter by means of the actuator function 9 with injecting 15000 sccm of Ar gas from the gas injecting part 17 of the planar pad 5. At that time, a repulsion force acts between the planar pad 5 and the wafer 4 surface continuously while the planar pad 5 is coming close before contact because the planar pad 5 comes close to the wafer 4 surface with injecting Ar gas. The load detection part 9 detects the repulsion force, and the control part 20 controls the actuator function 9 so as to keep the load constant to thereby keep the distance between the planar pad 5 and the wafer 4 surface constant.

In the present embodiment 1, the load is kept at 150 Newton to keep the distance of 30 $\mu$m between the planar pad 5 and the wafer 4 surface. In other words, the distance between the pad surface (15) and the wafer surface (4) is controlled by detecting the force that acts between the pad part 15 and wafer 4 by means of the load detection part 19. In detail, Ar gas supplied from the planar pad 5 causes high gas pressure condition in the space between the pad surface (15) and wafer surface (4). The load is caused between the pad part 15 and wafer 4 though the pad part is not in contact with the wafer 4, and hence the space between the pad part and wafer surface is controlled by controlling the load and gas flow rate. A piezo device, strain meter, spring, elastic material, or weight may be used as the weight detection part 19, and a member comprising combined these components may be used also as the weight detection part 19. It is effective to keep the space of 1 to 100 $\mu$m between the pad part surface and the main surface of the wafer 4, and more preferably space of 5 to 30 $\mu$m. The narrowest space between the pad surface and wafer surface gives the highest cleaning effect only in consideration of cleaning effect, but the narrowest space does not allow the space to be kept constant, and is apt to cause damage on the wafer 4 surface due to possible contact when the space is narrowed excessively. Based on the above-mentioned reason, the space of 5 to 30 $\mu$m is most effective.

As described hereinabove, the proximity of the planar pad 5 to the wafer surface with injection of Ar gas generates high-speed gas flow between the planar pad 5 and wafer 4. The gas flow causes viscous friction force in the horizontal direction of the wafer surface. The viscous friction force causes substance movement force in non-contact condition. As the result, fine particles adsorbed on the wafer 4 surface can be removed. According to the one of important points of the present invention, the friction force due to the gas flow is utilized to remove particles 26 adsorbed on the wafer surface.

(e) Furthermore, the planar pad 5 is swung on the wafer 4 surface. The swing motion mechanism 8 of the planar pad 5 and the rotation function of the wafer setting means 3 exert the viscous friction force due to high speed gas flow on the wafer 4 surface for a certain time (T1). The viscous friction force is exerted on the entire wafer surface.

(f) Subsequently, the plasma of the first gas is stopped. In other words, the plasma generation is stopped.

(g) Subsequently, the planar pad 5 is moved aside from the wafer 4 surface, and gas injecting from the gas injecting part 17 of the planar pad 5 is stopped. The cleaning is finished though the above-mentioned processes.

As described hereinabove, it is possible to remove particles on the wafer surface by applying adsorption force reduction of the particles adsorbed on the wafer surface due to electric charges and radicals supplied from plasma generated from the first gas and by applying viscous friction force due to high speed gas flow generated between the planar pad 5 and the wafer 4 surface that are brought close each other.

The control part 20 controls not only the actuator function 9 with signal of the load transfer part 19 but also rotation of the wafer setting means 3, the gas introducing means 6, the gas introducing means 7, the swing motion mechanism 8, the plasma generating means 2, and the infrared lamp control part. These components function conformably to a program.

Considerable amount of fluorine remains on the wafer surface after cleaning because plasma containing $CF_4$ gas is irradiated on the wafer in the cleaning process. If the wafer that adsorbs fluorine is exposed to the atmosphere, the fluorine reacts with moisture in the atmosphere to generate hydrofluoric acid to thereby convert the wafer surface possibly. To avoid such trouble, it is required for the wafer to be exposed to the atmosphere after the fluorine, which is adsorbed on the wafer 4 surface after cleaning, is made harmless.

(h) After cleaning, the planar pad 5 is moved aside from the wafer 4 surface. Then, hydrogen gas that is diluted with Ar to 3% (Ar+$H_2$(3%)) and oxygen are introduced from the gas introducing means 6 as the second gas, and plasma generated by means of the plasma generating means 2 is irradiated on the wafer 4 for a certain time (T2). H radicals of plasma generated from hydrogen raw material are supplied to the wafer surface to thereby convert the fluorine adsorbed on the wafer surface to HF. The converted HF is evaporated from the wafer surface because of vacuum and exhausted to the outside. As the result, fluorine is removed from the wafer 4 surface after cleaning, and conversion that would occur when the wafer 4 is exposed to the atmosphere is prevented.

The oxygen contained in the second gas is served to remove deposited film of reaction product of carbon and hydrogen that are residual in the vacuum vessel 1. The reason why hydrogen diluted with Ar gas is used is that hydrogen diluted to the concentration of 3% or lower is not inflammable. The inflammability brings about safety and reduced cost for handling. Dilution to a concentration of about 3% is sufficient.

The infrared lamp 14 heats the wafer 4 to a temperature of about 200 degrees or lower during treatment of the wafer surface with plasma of the second gas after cleaning. The heating promotes HF on the wafer 4 surface generated by H radicals to be evaporated to thereby result in effective removal of HF.

Continuous heating of wafer by means of the infrared lamp 14 through introduction of the first gas for cleaning and introduction of the second gas brings about the same effective result. Overheating of the wafer 4 in cleaning also results in improved cleaning effect. The wafer surface is subjected to plasma and lamp heating uniformly throughout the entire wafer surface by rotating the wafer in this process.

(i) After the above-mentioned (h) process is completed, rotation of the wafer 4 is stopped.

(j) Subsequently, the valve 11 is opened, and the wafer 4 is transferred from the vessel 1 to the transfer chamber 12 by means of the transfer arm 10.

Embodiment 2

Figure 4:
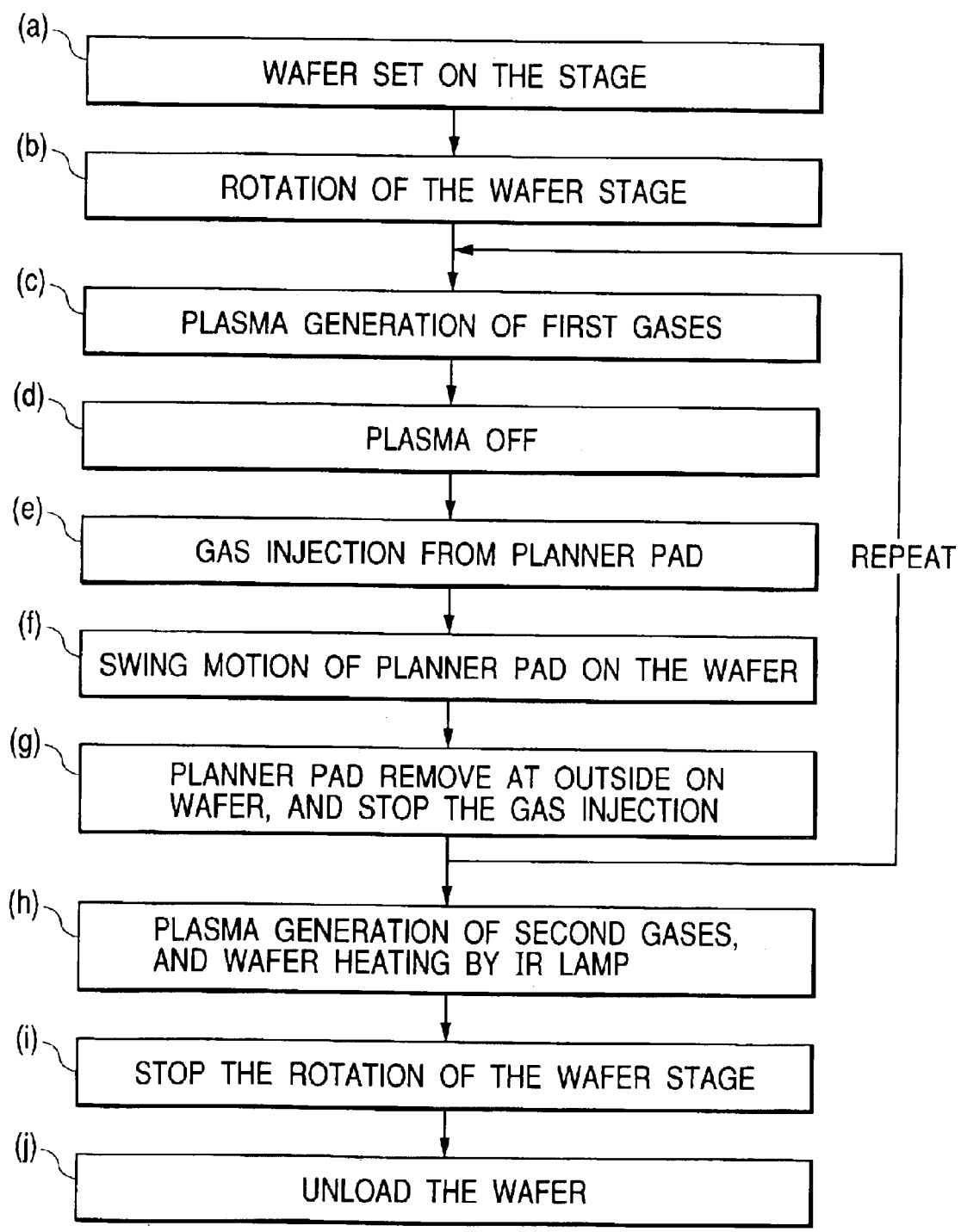
FIG. 4 is a cleaning flow chart applied in embodiment 2 of the present invention.
Figure 5A:
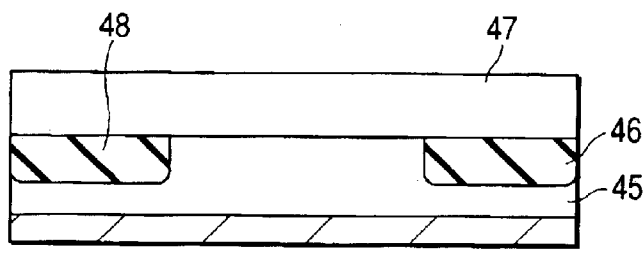
FIG. 5A is a process diagram showing a step of the manufacturing process for a semiconductor device in embodiment 3 of the present invention.
Figure 5B:
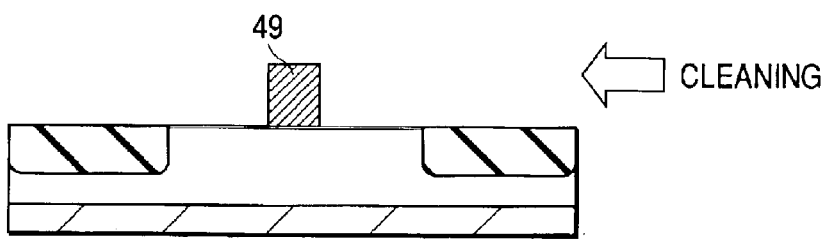
FIG. 5B is a process diagram showing a step of the manufacturing process for a semiconductor device in embodiment 3 of the present invention.
Figure 5C:
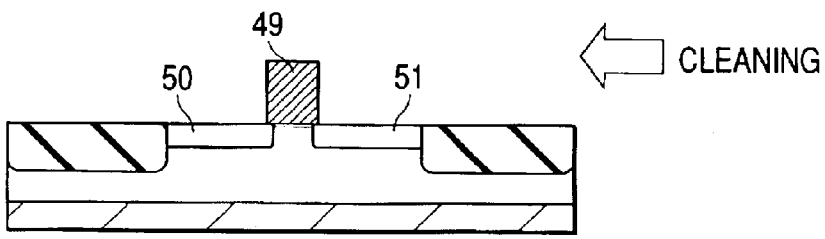
FIG. 5C is a process diagram showing a step of the manufacturing process for a semiconductor device in embodiment 3 of the present invention.
Figure 5D:
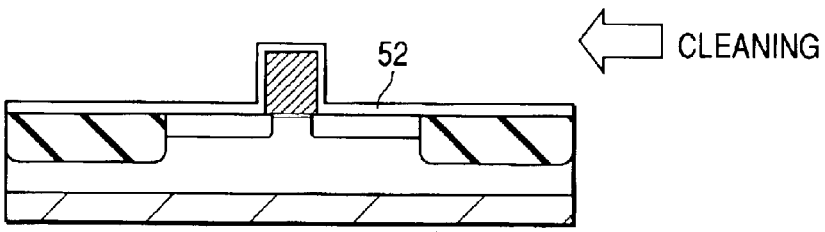
FIG. 5D is a process diagram showing a step of the manufacturing process for a semiconductor device in embodiment 3 of the present invention.
Figure 5E:
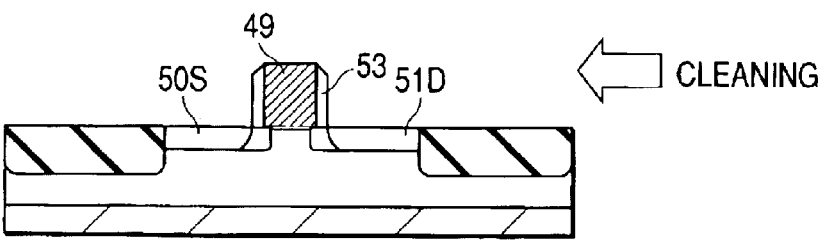
FIG. 5E is a process diagram showing a step of the manufacturing process for a semiconductor device in embodiment 3 of the present invention.
Figure 5F:
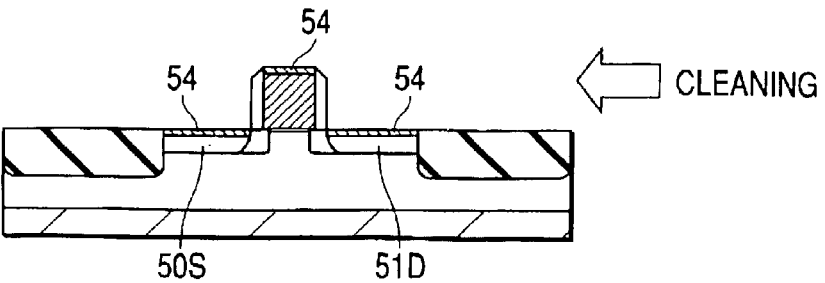
FIG. 5F is a process diagram showing a step of the manufacturing process for a semiconductor device in embodiment 3 of the present invention.

Embodiment 2, which is different from embodiment 1, will be described with reference to FIG. 4. In embodiment 1, plasma generation from the first gas is carried out simultaneously with viscous friction force application due to high-speed gas on the wafer 4 surface by means of the planar pad. On the other hand, in embodiment 2, plasma generation from the first gas is carried out separately from viscous friction force application due to high-speed gas on the wafer 4 surface by means of the planar pad.

(a) A wafer 4 is set on the wafer setting means 3 in the dry cleaning system shown in FIG. 1.

(b) Subsequently, the wafer 4 is rotated by means of rotation function of the wafer setting means 3. At that time, the planar pad 5 is apart from the wafer 4 surface.

(c) Subsequently, the first gas is converted to plasma by means of the plasma generating means and the plasma is irradiated on the rotating wafer 4 for a certain time (T1) to thereby reduce the adsorption force of particles adsorbed on the wafer 4 surface. This process is referred to as pretreatment of cleaning that will be carried out in process (e).

(d) Subsequently, plasma generation is stopped.

(e) Subsequently, the planar pad 5 is replaced on the wafer 4 surface and brought close to the wafer 4 surface with injection of Ar gas in the same manner as carried out in embodiment 1. Viscous friction force due to high-speed gas flow is exerted on the entire surface of the wafer 4 with horizontal swinging of the planar pad 5 on the wafer 4 surface. Cleaning by means of viscous friction force is carried out for a certain time (T2) in this process.

(f) After process (e), the planar pad 5 is moved away from the wafer 4 surface again. Injection of the gas from the planar pad 5 is stopped.

The above-mentioned cleaning process involving the plasma irradiation of the first gas and the viscous friction force is repeated as required to clean the wafer 4. In other words, the processing including from process (c) to process (f) is repeated as required. After completion of cleaning, the sequence proceeds in the same manner as carried out in embodiment 1 as described herein under.

(g) After completion of cleaning, the planar pad 5 is moved away from the wafer 4 surface.

(h) Subsequently, hydrogen gas that is diluted with Ar to 3% (Ar+$H_2$(3%)) and oxygen are introduced from the gas introducing means 6 as the second gas, and plasma generated by means, of the plasma generating means 2 is irradiated on the wafer 4 for a certain time (T2). H radicals of plasma generated from hydrogen raw material are supplied to the wafer surface to thereby convert the fluorine adsorbed on the wafer surface to HF. The converted HF is evaporated from the wafer surface because of vacuum and exhausted to the outside.

As the result, fluorine is removed from the wafer 4 surface after cleaning, and conversion that would occur when the wafer 4 is exposed to the atmosphere is prevented. The oxygen contained in the second gas is served to remove deposited film of reaction product of carbon and hydrogen that are residual in the vacuum vessel 1. The reason why hydrogen diluted with Ar gas is used is that hydrogen diluted to the concentration of 3% or lower is not inflammable. The inflammability brings about safety and reduced cost for handling. Dilution to a concentration of about 3% is sufficient.

The infrared lamp 14 heats the wafer 4 to a temperature of about 200 degrees or lower during treatment of the wafer surface with plasma of the second gas after cleaning. The heating promotes HF on the wafer 4 surface generated by H radicals to be evaporated to thereby result in effective removal of HF. Continuous heating of wafer by means of the infrared lamp 14 through introduction of the first gas for cleaning and introduction of the second gas brings about the same effective result. Overheating of the wafer 4 in cleaning also results in improved cleaning effect.

The wafer surface is subjected to plasma and lamp heating uniformly throughout the entire wafer surface by rotating the wafer in this process.

(i) After the above-mentioned (h) process is completed, rotation of the wafer 4 is stopped.

(j) Subsequently, the valve 11 is opened, and the wafer 4 is transferred from the vessel 1 to the transfer chamber 12 by means of the transfer arm 10.

According to embodiment 2, plasma is not irradiated while the planar pad 5 is being on the wafer 4 surface, and embodiment 2 is advantageous over the above-mentioned embodiment 1 in the points described herein under.

In the process (c), the planar pad 5 is placed apart form the wafer 4 surface. Therefore, the planar pad 5 will not prevent the irradiation of plasma partially on the wafer 4 surface, and the entire surface of the wafer 4 is exposed to irradiation. The particle adsorption force reduction effect is improved by action of plasma. Furthermore, the particle adsorption force reduction effect distributes uniformly over the entire surface of the wafer 4.

Furthermore, the wafer 4 surface that is not covered partially with the planar pad 5 during plasma irradiation does not cause uneven potential due to plasma on the wafer 4 surface. As the result, devices such as transistors that are built in the wafer 4 surface are not subjected to damage.

The infrared lamp is used as a means for heating the wafer 4 in the embodiment 1 and embodiment 2, but a heater that is built in the wafer setting means 3 may be used to heat the wafer 4. Heating by the heater gives the same effect of the infrared lamp. The wafer setting means 3 provided with a built-in heater is more effective for uniform heating of the entire surface of the wafer 4.

Furthermore, plasma generated from the second gas is used to remove radicals after cleaning in the embodiment 1 and embodiment 2, but heating of the wafer 4 at a temperature of, for example, 200 degrees to 300 degrees by use of a heating means such as infrared lamp 14 in the vacuum vessel 1 may be employed to obtain the HF removal effect. In other wards, the energy larger than the adsorption energy of fluorine is applied to activate fluorine on the substrate surface to thereby cause thermal dissociation and exhaustion of the fluorine.

A mixed gas containing $CF_4$ and oxygen ($O_2$), that is used for suppressing of deposition film formation) is used as the first gas in embodiment 1 and embodiment 2. However, a mixed gas containing oxygen ($O_2$) and one of gases selected from a group of a gas containing chlorine element such as $Cl_2$ or $BCl_3$, a gas containing fluorine element such as $C_2F_6$, $SF_6$, $F_2$, or HF, and a gas containing hydrogen such as $NH_3$, $H_2$, or $CH_4$ may be used as other first gas. The type of the first gas is selected depending on material and structure of the wafer surface to be cleaned. Therefore, oxygen ($O_2$) gas is used alone as the first gas depending on the case.

Ar is used as a gas that is injected from the planar pad 5 in embodiment 1 and embodiment 2, but $N_2$, He, Ne, Kr, or Xe may be used to obtain the same effect. Among these gases, Ar, He, and Ne are used advantageously in virtue of low cost and less chemical attack.

Furthermore, hydrogen diluted with Ar (Ar+$H_2$(3%)) and $O_2$ are used as the second gas in embodiment 1 and embodiment 2, but one of gases selected from a group of Ne, Kr, Xe, He, and $N_2$ may be selected to obtain the same effect.

Furthermore, plasma generated from any one of Ne, Kr, Xe, He, $N_2$, and $O_2$ containing no hydrogen is sufficiently effective depending on the degree of remaining radicals. Less residual radicals and less damage due to the first gas allows plasma processing with the second gas to be omitted, and only the overheating of wafer by means of the infrared lamp described in the above-mentioned embodiments may be applied to obtain sufficient effect.

In the case as described hereinabove, introduction of the second gas and plasma processing with the gas are not necessarily applied.

Embodiment 3

Next, an embodiment in which the cleaning method described in embodiment 1 and embodiment 2 is applied in a step for forming active area in a wafer will be described. Application of embodiment 1 or embodiment 2 in active area forming stage is effective to prevent quality deterioration of semiconductor devices such as MISFET.

A MISFET is formed according to the sequential processes shown in FIG. 5A to FIG. 5F including (a) separation and forming of elements and deposition of a gate polycrystalline silicon, (b) forming of a gate electrode (etching of polycrystalline silicon), (c) forming of extension (N-area) by means of ion-implantation, (d) deposition of a nitride film, (e) forming of a gate electrode side wall protection film (etching of nitride film), and (f) forming of silicide film. Cleaning described in, for example, embodiment 2 is carried out in the time between each process and the next process. Processes (a) to (f) will be described briefly herein under.

(a) A groove separation area 46 is formed on a silicon substrate 45 to separate element. The silicon substrate 45 comprises a p-type substrate on which a p-well is formed. Subsequently, a gate polycrystalline silicon 47 is deposited with interposition of a gate oxide film (not shown in the drawing). The gate polycrystalline silicon 47 is formed by CVD in a vacuum processing chamber.

(b) The polycrystaliine silicon is dry-etched in the vacuum processing chamber to form a gate electrode 49.

(c) Extensions (N-areas 50 and 51) matching with the gate electrode 49 are formed by ion implantation. The extension is a source-drain area having a relatively low concentration formed to cope with hot electrons.

(d) A nitride film 52 is deposited on the semiconductor substrate 45 having the gate electrode 49 by plasma CVD.

(e) The nitride film 52 is subjected to dry-etching (anisotropic etching) to form a gate side wall protection film 53 on the side wall of the gate electrode 49. Dry cleaning described in embodiment 1 is carried out thereafter. A contact N+ area (source and drain areas 50S and 51D) having a relatively high concentration matching with the gate side wall protection film 53 is formed by ion implantation.

(f) Subsequently, silicide layers 54 are formed on the surface of the source-drain areas 50S and 51 and the surface of the gate electrode 49 to render it low-resistant. The silicide layer 4 is formed by, for example, adsorbing cobalt on the source-drain areas 50S and 51D and the surface of the gate electrode 49 and by heat-treating it.

$CF_4+O_2$ is used as the first gas in embodiment 3 as in the case of embodiment 1 or embodiment 2. Hydrogen diluted with Ar is used as the second gas as in the case of embodiment 1 or embodiment 2.

Usually, wet cleaning with various chemical solutions is employed in gate electrode forming process of MISFET. Particles that remain after each process can be removed by dry cleaning according to the present invention, hence cleaning with chemical solution can be omitted or reduced significantly. Particularly, diluted chemical solution is enough for effective cleaning, and the dimension shift of the gate electrode and waste solution treatment cost that are caused from chemical solution treatment is suppressed.

According to embodiment 3 described hereinabove, dry cleaning is employed in the MISFET forming process between each process and the next process to thereby result in improved manufacturing yield and reduced cost of high performance semiconductor devices. In the present embodiment, the manufacturing process for semiconductor devices is described with reference to the example of one MISFET shown in FIG. 11. A plurality of MISFETs that are described hereinabove are formed actually on one semiconductor substrate so as to constitute a semiconductor integrated circuit device such as LSI or VLSI.

Embodiment 4

Figure 6:
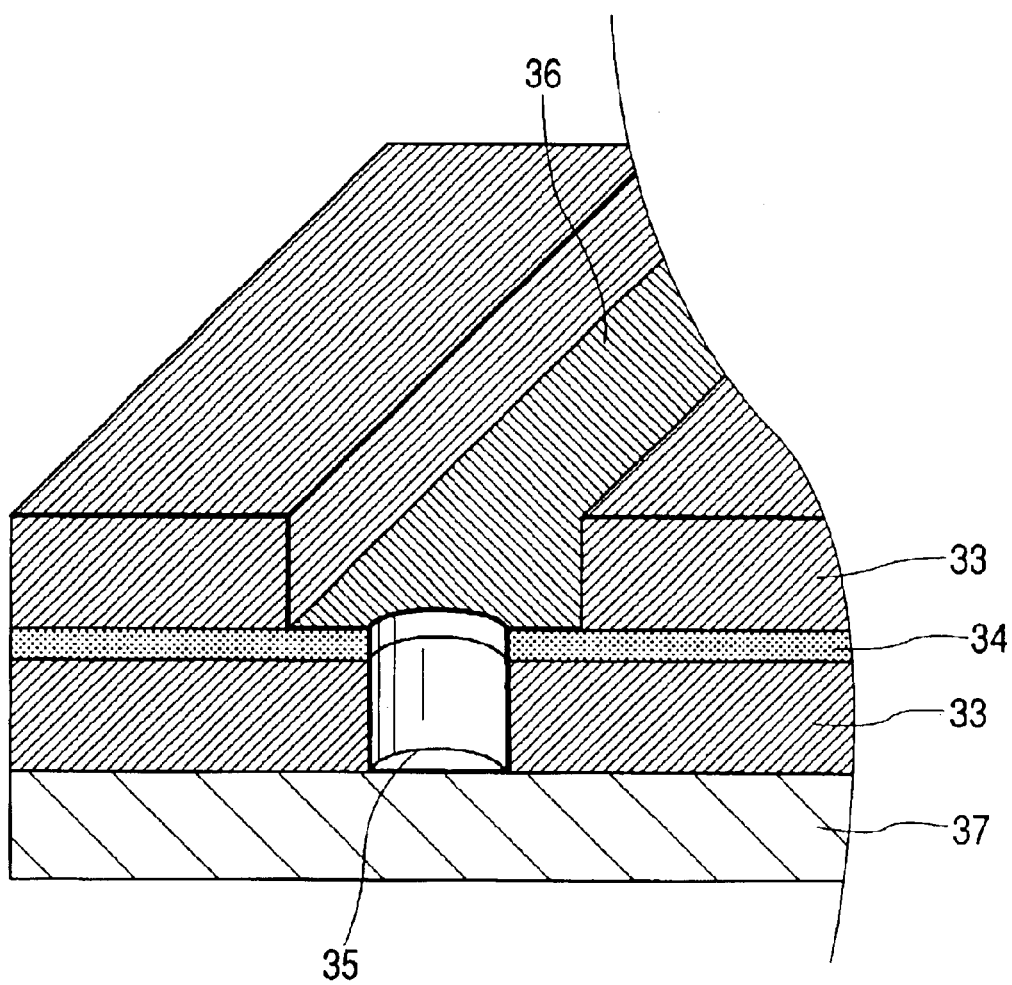
FIG. 6 is a cross sectional view of showing the manufacturing process for a semiconductor device in embodiment 4 of the present invention.
Figure 7:
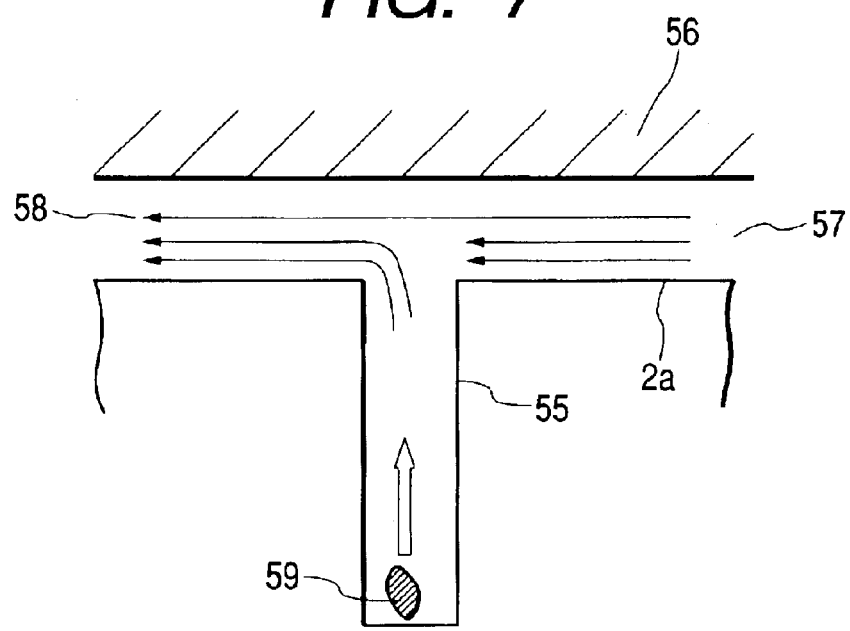
FIG. 7 is an explanatory diagram showing particle removal in a contact hole (or through hole) in the present invention.
Figure 8:
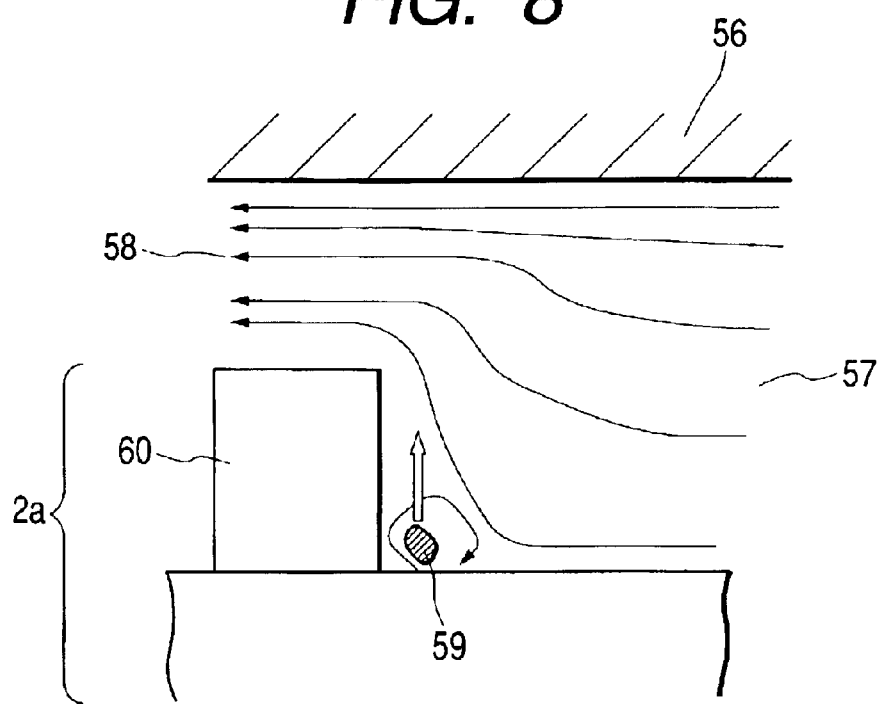
FIG. 8 is an explanatory diagram showing particle removal on a wiring corner in the present invention.

FIG. 6 is a perspective view partially showing the manufacturing process for semiconductor integrated circuit device. Particularly, a via contact forming process on an interlayer dielectric by dry etching is shown. A dielectric film 33 comprises a dielectric film consisting of low dielectric constant material (organic-base material), which is called as Low-k and is effective for high speed operation and energy saving of the semiconductor devices.

As shown in FIG. 6, the low dielectric film 33 is etched with plasma generated from a gas mainly containing hydrogen or ammonia to form a via contact and groove to obtain dual damascene. In other words, a wafer (substrate 37) having a dielectric film on which a via contact and groove are formed on the main surface is formed. A nitride film 34 interposed between low dielectric constant films 33 is served as an etching stopper film that is effective when the upper low dielectric constant film 33 is dry-etched.

Subsequently, dry cleaning is carried out. In the dry cleaning according to the present embodiment 4, the above-mentioned embodiment 1 is employed. Hydrogen or ammonia is used as the first gas. Various porous materials, SiOC, or SiOF may be used in addition to organic-base material for the low dielectric constant film. The first gas and the second gas to be used in cleaning process of the present invention are-selected suitably for the employed material. Usually, wet etching is carried out with various chemical solutions after etching of the interlayer dielectric. However, the dielectric film formed of low dielectric constant material is generally weak to moisture and chemicals, and moisture and such chemicals causes conversion and film performance deterioration of the dielectric film.

Application of cleaning according to the present invention after etching brings about reduced wet cleaning and brings about improved manufacturing precision and yield of semiconductor devices having low dielectric constant film.

Subsequently, Cu conduction layers are formed on the via contact 35 and groove 36. Such conduction layer (wiring structure) comprises four layers or five layers though not shown in the drawing. Hence the final yield depends significantly on the amount of residual particles after etching of each layer. It is possible to improve the yield by applying the cleaning according to the present invention after etching of each layer.

The above-mentioned embodiment 2 may be employed for the dry cleaning in the present embodiment 4.

In the above, the invention accomplished by the inventors of the present invention is described in detail based on the embodiments of the invention, however, the present invention is by no means limited to the above-mentioned embodiments, and various changes and modifications may be made in the invention without departing from the sprit and scope thereof. Detailed examples are described herein under.

In some manufacturing process for semiconductor integrated circuit devices, various conduction films (tungsten, aluminum, cobalt, or the like) or dielectric films ($SiO_2$ or the like) are formed by spattering. It is effective to apply the dry cleaning according to the present invention after spattering. Careful cleaning is required after forming of a spattering film because spattering accompanies generation of much dust generally. If wet brush cleaning is applied in this case, the wafer is damaged mechanically depending on the device structure formed on the wafer surface because relatively strong force is exerted on the wafer. On the other hand, application of dry cleaning according to the present invention after forming of spattering film allows the wafer to be cleaned without strong wet cleaning, and the freedom of the device structure is secured and the device manufacturing yield is improved.

In the above-mentioned embodiment 3, the wafer is subjected to the through process in vacuum without exposing to the atmosphere between etching process and dry cleaning process to thereby improve the reliability and productivity of the semiconductor integrated circuit devices.

What is claimed is:

1. A manufacturing method for semiconductor devices by use of a dry cleaning system having a vessel connected to a vacuum pump, a means for generating plasma, a gas supply means for supplying gas that is used for generating plasma, a wafer stage on which a wafer is to be set provided in said vessel, a planar pad provided with a gas hole for injecting gas toward the wafer and a flat part facing to the wafer, and a means for scanning said planar pad on said wafer, said manufacturing method comprises:

a step for setting a wafer on said wafer stage, a step in which a flat gas that is used for generating plasma is supplied into said vessel by means of said gas supply means maintaining the internal of said vessel at a reduced pressure by use of said vacuum pump to thereby generate a first plasma in said vessel by means of said means for generating plasma;

a step for cleaning the main surface of said wafer by applying the viscous friction force exerted due to gas flow of a third gas injected from said gas hole onto the main surface of said wafer that is brought close to the flat part of said planar pad and by applying action of electrons or radicals generated by said plasma together;

a step in which a second plasma is generated using a second gas in said vessel after said cleaning step and the main surface of said wafer is exposed to said second plasma, said step including removing an element of said first gas adsorbed on the wafer surface or a film of a reaction product of said first gas deposited on the wafer surface; and a step for transferring said wafer to the outside of said vessel.

2. The manufacturing method for semiconductor devices according to claim 1, wherein a step for cleaning the main surface of said wafer with action of electric charges or radicals generated from said first plasma is added as a pre-treatment after the step in which said first plasma is generated in said vessel.

3. The manufacturing method for semiconductor devices according to claim 2, wherein the third gas injected from said planar pad onto the wafer surface is any one gas of argon, helium, neon, krypton, xenon, and nitrogen.

4. The manufacturing method for semiconductor devices according to claim 1, wherein the component of said first gas contains molecule containing any one element of chlorine, fluorine, hydrogen, and oxygen.

5. The manufacturing method for semiconductor devices according to claim 4, wherein said first gas includes at least one of a gas containing chlorine is selected from a group consisting of $Cl_2$ and $BCl_3$, a gas containing fluorine is selected from a group consisting of $CF_4$, $C_2F_6$, $SF_6$, $F_2$, and HF, a gas containing hydrogen is selected from a group consisting of $NH_3$, $H_2$, and $CH_4$, and a gas containing oxygen is selected from $O_2$.

6. The manufacturing method for semiconductor devices according to claim 1, wherein oxygen gas is added to the first gas.

7. The manufacturing method for semiconductor devices according to claim 1, wherein a component of said second gas contains molecule containing hydrogen, and is diluted with any one gas of argon, neon, krypton, xenon, helium, and nitrogen.

8. The manufacturing method for semiconductor devices according to claim 1, wherein the second gas is any one gas of argon, neon, krypton, xenon, helium, nitrogen, and oxygen.

9. The manufacturing method for semiconductor devices according to claim 8, wherein oxygen is added to the second gas.

10. The manufacturing method for semiconductor devices according to claim 1, wherein a gate electrode formed by means of dry etching is provided on the main surface of said wafer set on said wafer stage.

11. The manufacturing method for semiconductor devices according to claim 1, wherein a dielectric film is provided on the main surface of said wafer set on said wafer stage, and a contact hole or through hole is provided on said dielectric film formed by means of dry etching.

12. The manufacturing method for semiconductor devices according to claim 11, further comprising a step for burying a conductor layer in said contact hole or through hole after the step of generating said second plasma.

13. The manufacturing method for semiconductor devices according to claim 11, wherein said dielectric film comprises an organic dielectric film.

14. A manufacturing method for semiconductor devices by use of a dry cleaning system having a vessel connected to a vacuum pump, a means for generating plasma, a gas supply means for supplying gas that is used for generating plasma, a wafer stage on which a wafer is to be set provided in said vessel, a planar pad provided with a gas hole for injecting gas toward the wafer and flat part facing to the wafer, and a means for scanning said planar pad on said wafer, said manufacturing method comprises:

a step for setting a wafer on said wafer stage, a step in which a gas that is used for generating plasma is supplied into said vessel by means of said gas supply means maintaining the internal of said vessel at a reduced pressure by use of said vacuum pump to thereby generate plasma in said vessel by means of said means for generating plasma;

a step for cleaning the main surface of said wafer by applying the viscous friction force exerted due to gas flow of a first gas injected from said gas hole onto the main surface of said wafer that is brought close to the flat part of said planar pad and by applying action of electrons or radicals generated by said plasma together;

a step in which plasma is generated using a second gas in said vessel after said cleaning step and the main surface of said wafer is exposed to plasma; and a step for transferring said wafer to the outside of said vessel, wherein a step for cleaning the main surface of said wafer with action of electric charges or radicals generated from plasma is added as a pre-treatment after the step in which plasma is generated in said vessel, and wherein a step for cleaning the main surface of said wafer with action of electric charges or radicals generated from plasma and a step for cleaning the main surface of said wafer with cooperative action of viscous friction force due to gas flow of said first gas injected from said gas hole of said planar pad having a flat part which is close to the main surface of said wafer and with action of electric charges or radicals generated from plasma that are applied simultaneously.

15. A manufacturing method for semiconductor devices by use of a dry cleaning system having a vessel connected to a vacuum pump, a means for generating plasma, a gas supply means for supplying gas that is used for generating plasma, a wafer stage on which a wafer is to be set provided in said vessel, a planar pad provided with a gas hole for injecting gas toward the wafer and flat part facing to the wafer, and a means for scanning said planar pad on said wafer, said manufacturing method comprises:

a step for setting a wafer on said wafer stage, a step in which a gas that is used for generating plasma is supplied into said vessel by means of said gas supply means maintaining the internal of said vessel at a reduced pressure by use of said vacuum pump to thereby generate plasma in said vessel by means of said means for generating plasma;

a step for cleaning the main surface of said wafer by applying the viscous friction force exerted due to gas flow of a first gas injected from said gas hole onto the main surface of said wafer that is brought close to the flat part of said planar pad and by applying action of electrons or radicals generated by said plasma together;

a step in which plasma is generated using a second gas in said vessel after said cleaning step and the main surface of said wafer is exposed to plasma; and a step for transferring said wafer to the outside of said vessel, wherein said dry cleaning system is provided with a wafer heating means, and said wafer is heated by means of said wafer heating means during a step for cleaning the main surface of said wafer and during a step for exposing the main surface of said wafer to plasma of the second gas.

16. The manufacturing method for semiconductor devices according to claim 15, wherein said wafer heating means is a heat source heated by means of a current provided in said wafer setting means.

17. The manufacturing method for semiconductor devices according to claim 15, wherein said wafer heating means is an infrared lamp.

18. A manufacturing method for semiconductor devices by use of a dry cleaning system having a vessel connected to a vacuum pump, a means for generating plasma, a gas supply means for supplying gas that is used for generating plasma, a wafer stage on which a wafer is to be set provided in said vessel, a planar pad provided with a gas hole for injecting gas toward the wafer and flat part facing to the wafer, and a means for scanning said planar pad on said wafer, said manufacturing method comprises:

a step for setting a wafer on said wafer stage, a step in which a gas that is used for generating plasma is supplied into said vessel by means of said gas supply means maintaining the internal of said vessel at a reduced pressure by use of said vacuum pump to thereby generate plasma in said vessel by means of said means for generating plasma;

a step for cleaning the main surface of said wafer by applying the viscous friction force exerted due to gas flaw of a first gas injected from said gas hole onto the main surface of said wafer that is brought close to the flat part of said planar pad and by applying action of electrons or radicals generated by said plasma together;

a step in which plasma is generated using a second gas in said vessel after said cleaning step and the main surface of said wafer is exposed to plasma; and a step for transferring said wafer to the outside of said vessel, wherein said dry cleaning system is provided with a wafer heating means, and a step for heating said wafer in said vessel for a certain time is added after said cleaning step instead of said step for exposing the main surface of said wafer to plasma generated from the second gas in said vessel.

19. A manufacturing method for semiconductor devices by use of a dry cleaning system having a vessel connected to a vacuum pump, a means for generating plasma, a gas supply means for supplying gas that is used for generating plasma, a wafer stage on which a wafer is to be set provided in said vessel, a planar pad provided with a gas hole for injecting gas toward the wafer and flat part facing to the wafer, and a means for scanning said planar pad on said wafer, said manufacturing method comprises:

a step for setting a wafer on said wafer stage, a step in which a gas that is used for generating plasma is supplied into said vessel by means of said gas supply means maintaining the internal of said vessel at a reduced pressure by use of said vacuum pump to thereby generate plasma in said vessel by means of said means for generating plasma;

a step for cleaning the main surface of said wafer by applying the viscous friction force exerted due to gas flow of a first gas injected from said gas hole onto the main surface of said wafer that is brought close to the flat part of said planar pad and by applying action of electrons or radicals generated by said plasma together;

a step in which plasma is generated using a second gas in said vessel after said cleaning step and the main surface of said wafer is exposed to plasma; and a step for transferring said wafer to the outside of said vessel, wherein a film deposited by means of spattering is provided on the main surface of said wafer set on said wafer stage.

* * * * *